United States Patent
Kim

(10) Patent No.: US 9,025,389 B2
(45) Date of Patent: May 5, 2015

(54) ERASING METHOD OF NON-VOLATILE MEMORY DEVICE

(75) Inventor: Se-Hyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 258 days.

(21) Appl. No.: 13/606,627

(22) Filed: Sep. 7, 2012

(65) Prior Publication Data

US 2013/0229872 A1 Sep. 5, 2013

(30) Foreign Application Priority Data

Mar. 2, 2012 (KR) ........................ 10-2012-0021753

(51) Int. Cl.
| | | |
|---|---|---|
| G11C 16/16 | (2006.01) | |
| G11C 11/56 | (2006.01) | |
| G11C 16/04 | (2006.01) | |
| G11C 16/14 | (2006.01) | |

(52) U.S. Cl.
CPC ............. *G11C 16/16* (2013.01); *G11C 11/5635* (2013.01); *G11C 2211/5648* (2013.01); *G11C 16/0483* (2013.01); *G11C 16/14* (2013.01)

(58) Field of Classification Search
CPC ........... G11C 11/5635; G11C 16/0483; G11C 16/16; G11C 2211/5648
USPC ............. 365/185.11, 185.17, 185.18, 185.22, 365/185.23, 185.29, 185.33
See application file for complete search history.

(56) References Cited

U.S. PATENT DOCUMENTS

| | | | |
|---|---|---|---|
| 2005/0018489 A1* | 1/2005 | Hosono .................... | 365/185.29 |
| 2005/0041515 A1* | 2/2005 | Futatsuyama et al. ........ | 365/232 |
| 2007/0047327 A1* | 3/2007 | Goda et al. ............... | 365/185.29 |
| 2007/0230253 A1* | 10/2007 | Kim ......................... | 365/185.29 |
| 2007/0236990 A1* | 10/2007 | Aritome ................... | 365/185.01 |

FOREIGN PATENT DOCUMENTS

KR 1020100015423 2/2010

* cited by examiner

*Primary Examiner* — J. H. Hur

(74) *Attorney, Agent, or Firm* — IP & T Group LLP

(57) ABSTRACT

A method for erasing a first sub-block of a plurality of sub-blocks included in a block of a non-volatile memory device, wherein the first sub-block includes at least one word line, includes applying an erase voltage to a substrate, applying a third voltage lower than the erase voltage to the word line of the first sub-block, applying a first voltage at least one word line adjacent to the word line of the first sub-block, and applying a second voltage that is the same as or similar to the erase voltage to the other word lines, where the first voltage has a level between the third voltage and the second voltage.

18 Claims, 5 Drawing Sheets

ERASING METHOD OF NON-VOLATILE MEMORY DEVICE

CROSS-REFERENCE TO RELATED APPLICATIONS

The present application claims priority of Korean Patent Application No. 10-2012-0021753, filed on Mar. 2, 2012, which is incorporated herein by reference in its entirety.

BACKGROUND

1. Field

Exemplary embodiments of the present invention relate to a method for operating a non-volatile memory device, and more particularly, to an erasing method of a non-volatile memory device.

2. Description of the Related Art

A non-volatile memory device retains data stored therein although power is turned off. Diverse non-volatile memory devices including a NAND-type flash memory are applied to various systems and devices.

In the non-volatile memory device, a program operation for storing a data in a memory cell and a read operation for reading a data stored in a memory cell are generally performed on the basis of a page, while an erase operation for deleting a data stored in a memory cell is performed on the basis of a block.

Meanwhile, a non-volatile memory device is required to operate in a limited number of erase-program cycles to reliably store data. This is because memory cells are deteriorated as the erase operation and the program operation are performed repeatedly. Since an erase operation is always performed before a program operation, the number of the cycles of the program operations and the number of the cycles of the erase operations are the same.

However, since the erase operation is performed on a block basis whereas the program operation is performed on a page basis, if a data of one page in any one block is corrected, the entire block including the page is erased. This increases the number of erase-program cycles of the non-volatile memory device, eventually making the life-span of the non-volatile memory device short.

Therefore, Korean Patent Publication No. 10-2010-0015423 discloses a method of dividing one block into a plurality of sub-blocks and performing an erase operation on the basis of a sub-block.

According to the method, an erase operation may be performed only on the memory cells of a selected sub-block by applying an erase voltage, which is a positive high voltage, to a substrate, applying 0V to a word line of the selected sub-block, and applying a voltage that is substantially the same as the erase voltage to the other word lines.

SUMMARY

Exemplary embodiments of the present invention are directed to an erasing method of a non-volatile memory device that is capable of improving a sub-block erasing method.

In accordance with an exemplary embodiment of the present invention, a method for erasing a first sub-block of a plurality of sub-blocks included in a block of a non-volatile memory device, wherein the first sub-block includes at least one word line, includes applying an erase voltage to a substrate, applying a third voltage lower than the erase voltage to the word line of the first sub-block, applying a first voltage to at least one word line adjacent to the word line of the first sub-block, and applying a second voltage that is the same as or similar to the erase voltage to other word lines, where the first voltage has a level between the third voltage and the second voltage.

In accordance with another exemplary embodiment of the present invention, a method for erasing a first sub-block of a plurality of sub-blocks included in a block of a non-volatile memory device, wherein the first sub-block includes at least one word line, includes applying an erase voltage to the word line of the first sub-block, applying a third voltage higher than the erase voltage to a substrate, applying a first voltage to at least one word line adjacent to the word line of the first sub-block, and applying a second voltage that is the same as or similar to the third voltage to other word lines, where the first voltage has a level between the erase voltage and the second voltage.

In accordance with yet another exemplary embodiment of the present invention, a method for erasing a first sub-block of a plurality of sub-blocks included in a block of a non-volatile memory device, wherein the first sub-block includes at least one word line, includes performing an erase operation on the block when the number of erase-program cycles is less than a set number, and performing an erase operation on the first sub-block when the number of the erase-program cycles is equal to or greater than the set number.

DETAILED DESCRIPTION

Figure 1:
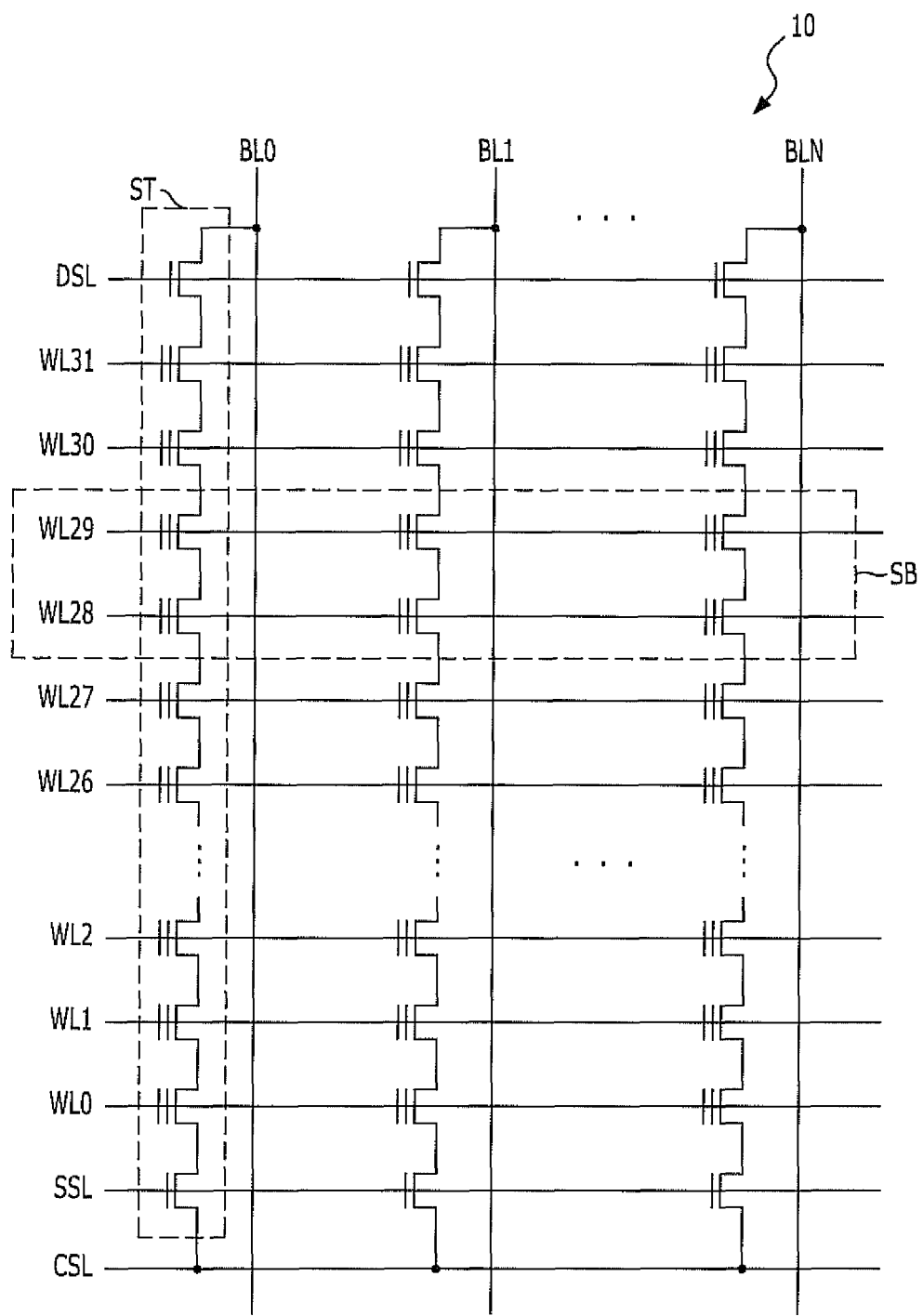
FIG. 1 is a circuit diagram illustrating a non-volatile memory device in accordance with an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a circuit diagram illustrating a non-volatile memory device in accordance with an exemplary embodiment of the present invention. For example, the drawing shows one block 10 of a plurality of memory blocks.

Referring to FIG. 1, the block 10 of the non-volatile memory device includes a plurality of bit lines BL coupled with one-side ends of strings ST and a common source line CSL coupled in common with the other-side ends of the strings ST.

Each of the strings ST includes a source selection transistor, a plurality of memory cells, and a drain selection transistor that are serially coupled. Here, the memory cells include a stacked structure of a floating gate and a control gate, and the control gates of corresponding memory cells in the respective strings ST extend in one direction, which is referred to as a first direction hereinafter, to form a word line WL. The gates of the drain selection transistors extend in the first direction to form a drain selection line DSL. The gates of the source selection transistors extend in the first direction to form a source selection line SSL. The common source line CSL extends in the first direction, and the bit lines BL extend in a second direction crossing the first direction.

Although the exemplary embodiment shows a case that one block 10 includes 32 word lines WL, which are word lines WL0 to WL31, the scope of the present invention is not limited to it, and the number of word lines may be changed diversely.

The block 10 may be divided into a plurality of sub-blocks. A sub-block is a unit for an erase operation, and it may include at least one page, which is a unit for a program operation or a read operation. Therefore, each sub-block includes at least one word line WL. The number of sub-blocks included in one block 10 and the number of word lines WL included in each sub-block may be changed diversely. For example, one block 10 may be divided into two or four sub-blocks.

Also, the number of word lines WL included in each sub-block may be the same or may be different. One sub-block may include one word line WL, whereas another sub-block includes two word lines WL and yet another sub-block includes three word lines WL. Also, each of the sub-blocks of one block 10 may include one word line WL.

An erase operation may be performed on the basis of a sub-block. If each of the sub-blocks of one block 10 includes one word line WL, the erase operation is performed on each word line WL, that is, it is performed on a page basis. Therefore, the erase operation by each page is included in an erase operation by each sub-block in a broad sense of meaning. Here, a target sub-block to be erased is referred to as a selected sub-block. In the embodiment of the present invention, a sub-block including word lines WL28 and WL29 is denoted as a selected sub-block SB for the description purposes. Hereinafter, an erase operation performed on the selected sub-block SB is exemplarily described with reference to FIGS. 2 and 3.

Figure 2:
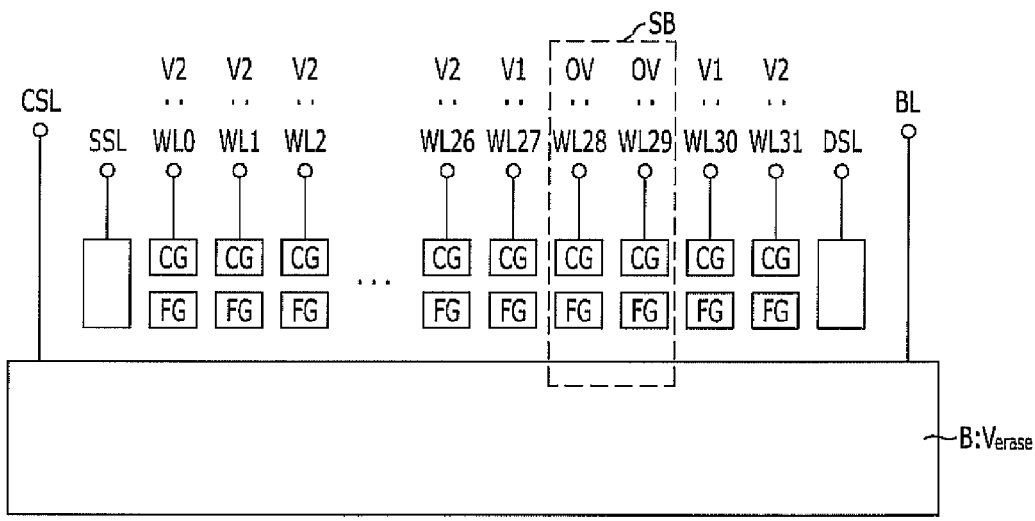
FIG. 2 is an explanatory diagram illustrating an erasing method of a non-volatile memory device in accordance with an exemplary embodiment of the present invention.

FIG. 2 illustrates an erasing method of a non-volatile memory device in accordance with an embodiment of the present invention. The drawing shows a cross section of any one string ST shown in FIG. 1.

Referring to FIG. 2, to erase the data of a memory cell included in the selected sub-block SB, an erase voltage $V_{erase}$, which is a positive high voltage, is applied to a substrate B, and a relatively lower voltage than the erase voltage $V_{erase}$, e.g., 0V, is applied to the word lines WL28 and WL29 of the selected sub-block SB. In this case, electrons stored in the floating gates FG of the memory cells coupled with the word lines WL28 and WL29 may be discharged to the substrate B through F-N tunneling and data of the memory cells may be erased. In other words, the difference between the erase voltage $V_{erase}$ and the lower voltage is controlled to such an extent that the F-N tunneling of the electrons is allowed. The erase voltage $V_{erase}$ may range from approximately 14V to approximately 20V.

Here, the data of the memory cells coupled with the word lines WL0 to WL27 and WL30 to WL31 except the selected sub-block SB are to be protected from being erased. To this end, a voltage that is substantially the same as the erase voltage $V_{erase}$ is applied to the word lines WL0 to WL27 and WL30 to WL31 according to conventional technology. The voltage that is substantially the same as the erase voltage $V_{erase}$ includes not only the same voltage but also similar voltages, for example, voltages that fall in the range of approximately 90% of the erase voltage $V_{erase}$. According to the conventional technology, however, when the selected sub-block SB is erased, the threshold voltages of the memory cells coupled with the word lines WL27 and WL30 adjacent to the word lines WL28 and WL29 may vary remarkably, compared with those of the memory cells coupled with the other word lines, for example, word lines WL0 to WL26 and WL31. These features are experimentally confirmed and described below with reference to FIG. 4.

The conventional memory device has these features because too much stress is caused by an electrical field between the voltage applied to the adjacent word lines WL27 and WL30 and the voltage applied to the word lines WL28 and WL29, that is, because the voltage applied to the adjacent word lines WL27 and WL30 is a high voltage that is substantially the same as the erase voltage $V_{erase}$, whereas the voltage applied to the word lines WL28 and WL29 is as low voltage as approximately 0V.

Therefore, in this embodiment of the present invention, a second voltage V2 that is substantially the same as the erase voltage $V_{erase}$, is applied to the other word lines WL0 to WL26 and WL31 except the word lines WL28 and WL29 and the adjacent word lines WL27 and WL30, and a first voltage V1 whose voltage level is between the low voltage applied to the word lines WL28 and WL29 and the second voltage V2 is applied to the adjacent word lines WL27 and WL30.

In this case, since voltage is changed step by step to the second voltage V2 through the first voltage V1 on both sides of the word lines WL28 and WL29 of the selected sub-block SB, the stress applied to the memory cells coupled with the adjacent word lines WL27 and WL30 declines to thereby decrease threshold voltage variation of the memory cells. As the first voltage V1 is decreased, it is advantageous in terms of reducing the stress.

However, when the first voltage V1 is decreased too much, the data of the memory cells coupled with the word lines WL27 and WL30 may be erased. Therefore, the first voltage V1 is to be controlled to an appropriate level. In this embodiment of the present invention, an intermediate value between the low voltage applied to the word lines WL28 and WL29 and the second voltage V2 may be used as the first voltage V1. For example, when the low voltage is approximately 0V and the second voltage V2 is approximately 16V, the first voltage V1 may be approximately 8V. According to an experiment, when the first voltage V1 is decreased to the intermediate value, the data of the memory cells coupled with the adjacent word lines WL27 and WL30 are not changed much, but when the first voltage V1 decreased below the intermediate value, data variation is deteriorated and even data may be erased. The experiment result will be described later with reference to FIGS. 5A and 5B.

Meanwhile, although the first voltage V1 is applied to one adjacent word line WL27 in one side of the selected sub-block SB and another adjacent word line WL30 in the other side of the selected sub-block SB in this embodiment, the scope of the present invention is not limited to it and the number of the adjacent word lines may be changed diversely. For example, the first voltage V1 may be applied to two adjacent word lines WL26 and WL27 in one side of the selected sub-block SB and two adjacent word lines WL30 and W31 in the other side of the selected sub-block SB in this embodiment.

The common source line CSL, the source selection line SSL, the drain selection line DSL, and the bit lines BL may receive a voltage of approximately 0V or may be in a floating state.

Figure 3:
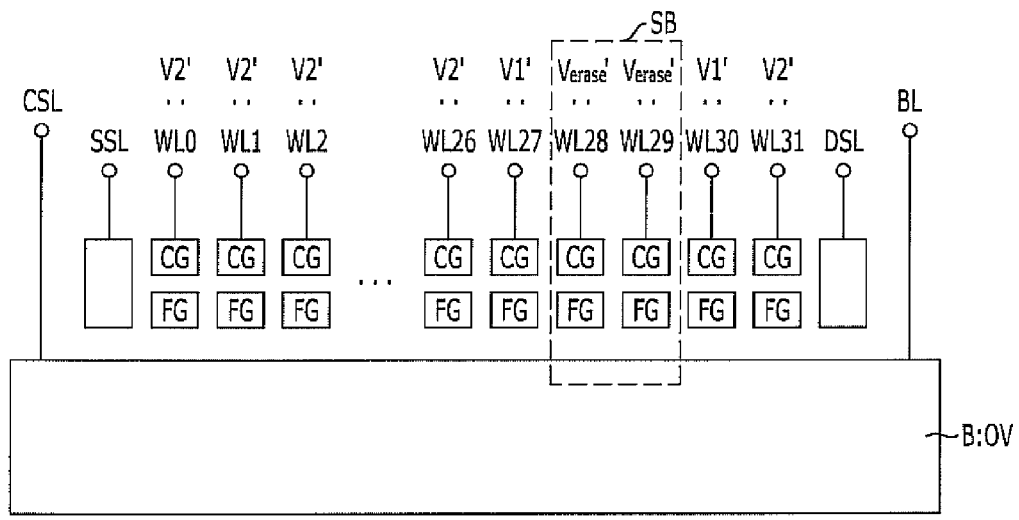
FIG. 3 is an explanatory diagram illustrating an erasing method of a non-volatile memory device in accordance with another exemplary embodiment of the present invention.

FIG. 3 illustrates an erasing method of a non-volatile memory device in accordance with another embodiment of the present invention.

Referring to FIG. 3, to erase the data of the memory cells included in the selected sub-block SB, the erase voltage $V_{erase}'$, which is a negative high voltage, is applied to the word lines WL28 and WL29 of the selected sub-block SB, and a voltage that is higher than the erase voltage $V_{erase}'$, e.g., approximately 0V, is applied to the substrate B. In this case, electrons stored in the floating gates FG of the memory cells coupled with the word lines WL28 and WL29 go through F-N tunneling to the substrate B, and as a result, data of the memory cells are erased. This is the same as described in the previous embodiment. The erase voltage $V_{erase}'$ may range from approximately −14V to approximately −20V.

Also, whereas the second voltage V2' that is substantially the same as the low voltage applied to the substrate B is applied to the other word lines WL0 to WL26 and WL31 except the adjacent word lines WL27 and WL30, a first voltage V1' whose level is between an erase voltage $V_{erase}'$ and a second voltage V2' is applied to the adjacent word lines WL27 and WL30. When the erase voltage $V_{erase}'$ is a negative voltage and the voltage applied to the substrate B is approximately 0V, the first voltage V1' is a negative voltage having a greater absolute value than that of the second voltage V2' and a smaller absolute value than that of the erase voltage $V_{erase}'$ Furthermore, the first voltage V1' may be an intermediate value between the second voltage V2' and the erase voltage $V_{erase}'$. When the second voltage V2' is approximately 0V, and the erase voltage $V_{erase}'$ is approximately −16V, the first voltage V1' may be approximately −8V.

Just as in the first embodiment, since the voltage varies step by step to the second voltage V2' through the first voltage V1' on both sides of the word lines WL28 and WL29 of the selected sub-block SB, the stress applied to the adjacent word lines WL27 and WL30 is reduced.

The common source line CSL, the source selection line SSL, the drain selection line DSL, and the bit lines BL may receive a voltage of approximately 0V or may be in a floating state.

Figure 4:
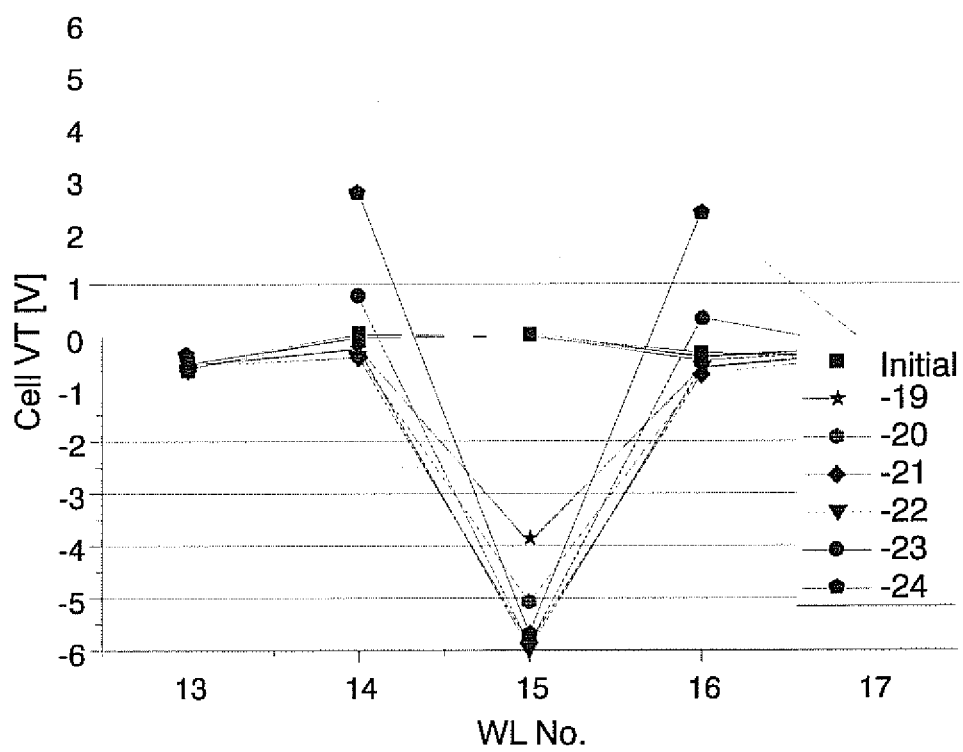
FIG. 4 is a graph showing a threshold voltage variation of a memory cell depending on the level of an erase voltage applied to a word line of a selected sub-block during an erase operation.

FIG. 4 is a graph showing a threshold voltage variation of a memory cell depending on the level of an erase voltage applied to a word line of a selected sub-block during an erase operation. The graph shows an observation result of threshold voltage variation, which is observed by increasing the voltage applied to the word line WL15 of the selected sub-block in a negative direction from approximately −19V when approximately 0V is applied to the substrate and the other word lines (in the graph, only word lines WL13 to WL17 are marked) except the word line WL15.

Referring to FIG. 4, it may be seen that the threshold voltages of the word lines WL14 and WL16 that are adjacent to the word line WL15 greatly vary, compared with the other word lines WL13 and WL17. In short, when a low voltage of approximately 0V is applied to the adjacent word lines WL14 and WL16, threshold voltage of memory cells coupled thereto may be changed due to the difference from the erase voltage applied to the word line WL15.

Figure 5A:
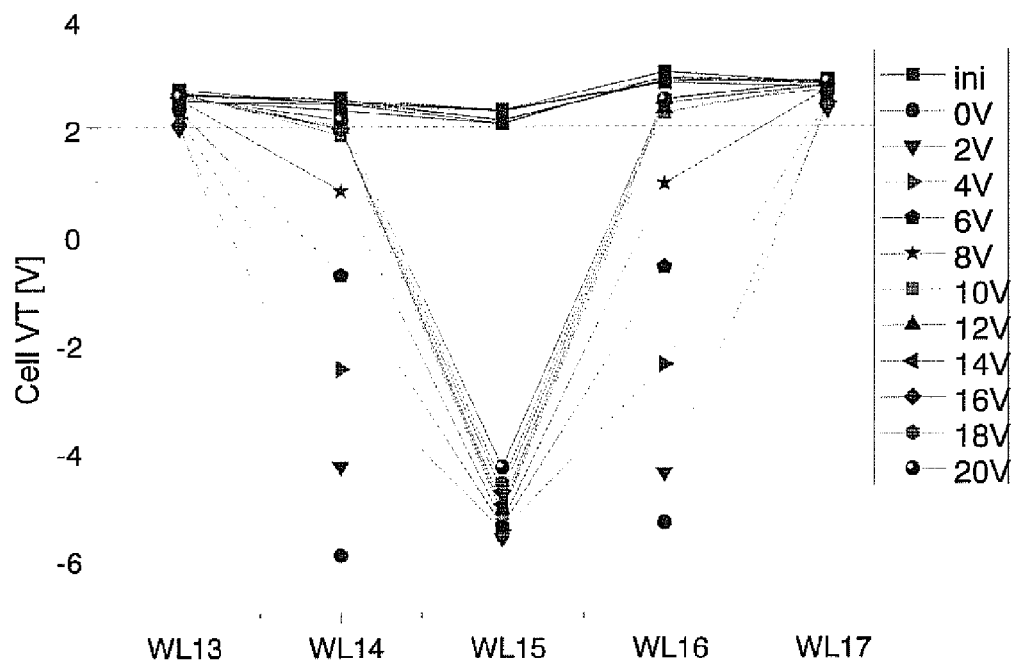
FIGS. 5A and 5B are graphs showing a threshold voltage variation of a memory cell depending on the level of a voltage applied to a word line adjacent to a selected sub-block during an erase operation.
Figure 5B:
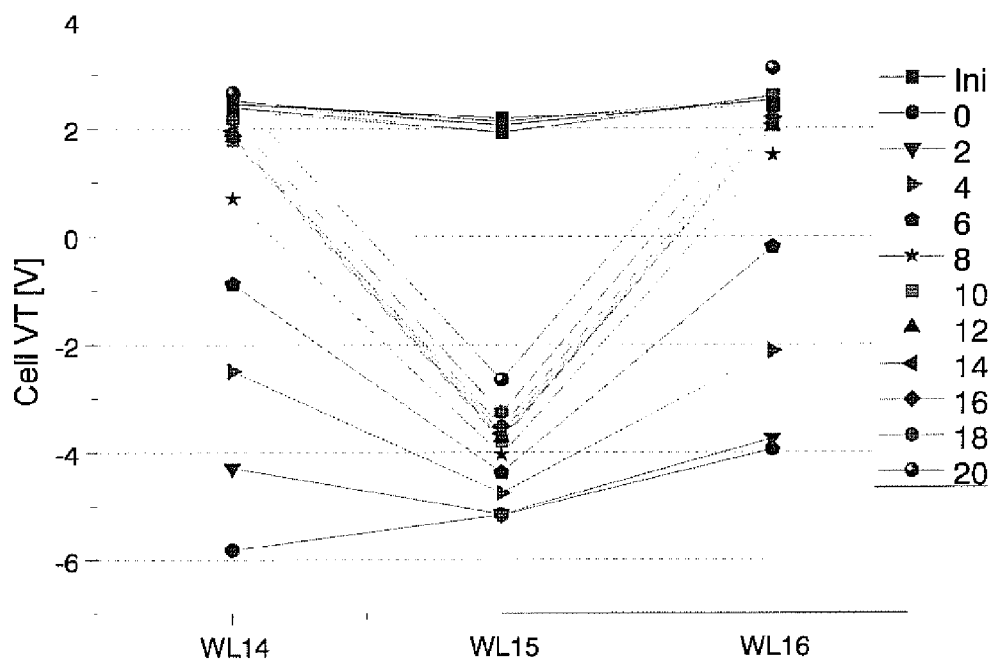

FIGS. 5A and 5B are graphs showing a threshold voltage variation of a memory cell depending on the level of a voltage applied to a word line adjacent to a selected sub-block during an erase operation. FIGS. 5A and 5B show graphs measured by equipments that are substantially the same as that of FIG. 1 but have different design rules. Also, FIGS. 5A and 5B are graphs measuring the threshold voltage of a memory cell by varying the voltage applied to the adjacent word lines WL14 and WL16 on the basis of approximately 2V from approximately 0V to approximately 20V, while applying an erase voltage of approximately 20V to the substrate, applying approximately 0V to the word line WL15 of the selected sub-block, and applying approximately 20V that is the same as the erase voltage to the other word lines (in the graph, only word lines WL13 to WL17 are marked) except the adjacent word lines WL14 and WL16.

It may be seen from FIGS. 5A and 5B that although the voltage applied to the adjacent word lines WL14 and WL16 is decreased from approximately 20V to an intermediate value between approximately 0V and approximately 20V, e.g., approximately 10V, the threshold voltages of the memory cells coupled with the adjacent word lines WL14 and WL16 are not changed much. In other words, the data of the memory cells coupled with the adjacent word lines WL14 and WL16 are retained.

On the other hand, when a voltage lower than the intermediate value (which is approximately 10V), e.g., approximately 8V or lower, is applied to the adjacent word lines WL14 and WL16, the threshold voltages of the memory cells coupled with the adjacent word lines WL14 and WL16 are decreased rapidly to a negative threshold voltage, and the data are erased.

Meanwhile, the sub-block-based erase operation is performed when the number of the erase-program cycles is equal to or greater than a given number. When the number of the erase-program cycles is less than the given number, the conventional block-based erase operation may be performed. When the erase-program cycle is run repeatedly and the memory cells are deteriorated, the sub-block-based erase operation is preferably performed. However, if the memory cells are not deteriorated yet, a block-based erase operation may be performed. The block-based erase operation is simpler and easier than the sub-block-based erase operation. This is described below with reference to FIG. 6.

Figure 6:
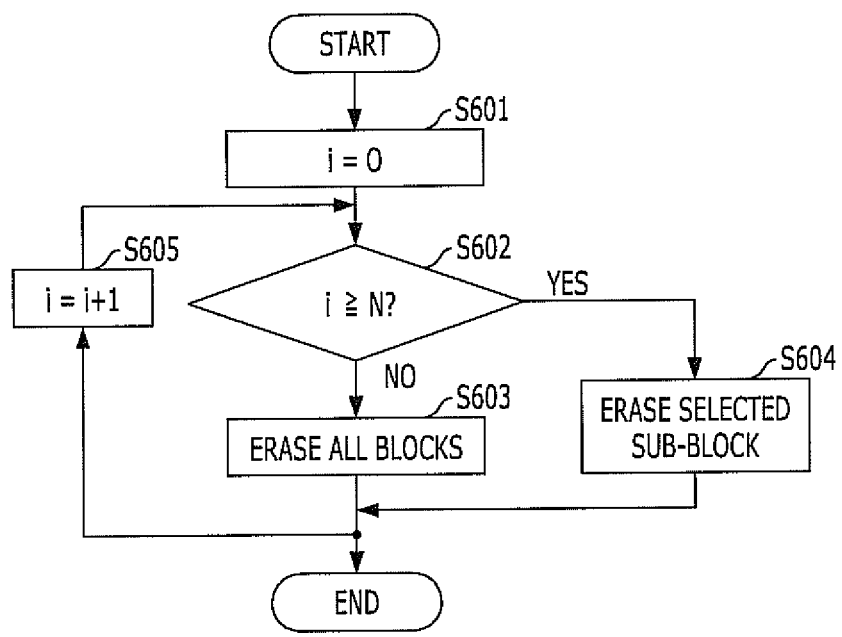
FIG. 6 is a flowchart describing an erasing method of a non-volatile memory device in accordance with yet another exemplary embodiment of the present invention.

FIG. 6 is a flowchart describing an erasing method of a non-volatile memory device in accordance with yet another embodiment of the present invention.

Referring to FIG. 6, when the initial erase operation begins, the number of erase-program cycles i is set to approximately 0 in step S601.

In step S602, it is decided whether the number of the erase-program cycles i is equal to or greater than a given number N, where N may be a natural number equal to or greater than 1.

As a result of the step S602, when the number of the erase-program cycles i is smaller than the given number N, an erase operation is performed on the entire block in step S603. When the number of the erase-program cycles i is equal to or greater than the given number N, an erase operation is performed on a selected sub-block in step S604. The method of erasing the data of the selected sub-block is as described with reference to FIG. 2 or 3.

After the erase operation of the step S603 or the step S604 is performed, since the number of the erase-program cycles i is increased by '1', the increase is reflected in step S605, and the processes of the steps S602 to S604 are repeated.

In other words, a loop formed of the processes 5602, S603 and S605 is repeatedly run until the number of the erase-program cycles reaches the given number N. After the number of the erase-program cycles reaches the given number N, a loop formed of the processes S602, S604 and S605 is repeated.

The number of the erase-program cycles i is stored and counted by using a test bit, and it is decided whether the number of the erase-program cycles reaches the given number N or not.

The erasing method of a non-volatile memory device in accordance with an embodiment of the present invention improves an erasing method that is performed on a sub-block basis.

While the present invention has been described with respect to the specific embodiments, it will be apparent to those skilled in the art that various changes and modifications may be made without departing from the spirit and scope of the invention as defined in the following claims.

What is claimed is:

1. A method for erasing a first sub-block of a plurality of sub-blocks included in a block of a non-volatile memory device, wherein the first sub-block includes at least one word line, comprising:
   applying an erase voltage to a substrate;
   applying a third voltage lower than the erase voltage to the at least one word line of the first sub-block;
   applying a first voltage to at least one adjacent word line adjacent to the at least one word line of the first sub-block; and
   applying a second voltage that is in the range of approximately 90% to 100% of the erase voltage to other word lines,
   wherein the first voltage has a level between the third voltage and the second voltage, and the erasing of the first sub-block is performed when the number of erase-program cycles is equal to or greater than a set number.

2. The method of claim 1, wherein the plurality of sub-blocks each includes at least one wordline.

3. The method of claim 1, wherein the first voltage has an intermediate value between the third voltage and the second voltage.

4. The method of claim 1, wherein the erase voltage ranges from approximately 14V to approximately 20V, and the third voltage is approximately 0V.

5. The method of claim 4, wherein the first voltage ranges from approximately 7V to approximately 10V.

6. The method of claim 1, wherein the at least one adjacent word line adjacent to the at least one word line of the first sub-block includes two word lines on one side of the first sub-block and two word lines on another side of the first sub-block.

7. A method for erasing a first sub-block of a plurality of sub-blocks included in a block of a non-volatile memory device, wherein the first sub-block includes at least one word line, comprising:
   applying an erase voltage to the at least one word line of the first sub-block; applying a third voltage higher than the erase voltage to a substrate;
   applying a first voltage to at least one adjacent word line adjacent to the at least one word line of the first sub-block; and
   applying a second voltage that is in the range of approximately 90% to 100% of the third voltage to other word lines,
   wherein the first voltage has a level between the erase voltage and the second voltage, and the erasing of the first sub-block is performed when the number of erase-program cycles is equal to or greater than a set number.

8. The method of claim 7, wherein the first voltage has an intermediate value between the erase voltage and the second voltage.

9. The method of claim 7, wherein the erase voltage ranges from approximately −14V to approximately −20V, and the third voltage is approximately 0V.

10. The method of claim 9, wherein the first voltage ranges from approximately −7V to approximately −10V.

11. The method of claim 7, wherein the at least one adjacent word line adjacent to the at least one word line of the first sub-block includes two word lines on one side of the first sub-block and two word lines on another side of the first sub-block.

12. A method for erasing a first sub-block of a plurality of sub-blocks included in a block of a non-volatile memory device, wherein the first sub-block includes at least one word line, comprising:
   performing an erase operation on the block when the number of erase-program cycles is less than a set number, and
   performing an erase operation on the first sub-block when the number of the erase-program cycles is equal to or greater than the set number.

13. The method of claim 12, wherein the performing of the erase operation on the first sub-block comprises:
   applying an erase voltage to a substrate; applying a third voltage lower than the erase voltage to the at least one word line of the first sub-block; applying a first voltage to at least one adjacent word line adjacent to the at least one word line of the first sub-block; and
   applying a second voltage that is in the range of approximately 90% to 100% of the erase voltage to other word lines,
   wherein the first voltage has a level between the third voltage and the second voltage.

14. The method of claim 13, wherein the first voltage has an intermediate value between the third voltage and the second voltage.

15. The method of claim 12, wherein the performing of the erase operation on the first sub-block comprises:
   applying an erase voltage to the at least one word line of the first sub-block;
   applying a third voltage higher than the erase voltage to a substrate;
   applying a first voltage to at least one adjacent word line adjacent to the at least one word line of the first sub-block; and
   applying a second voltage that is in the range of approximately 90% to 100% of the third voltage to other word lines, wherein the first voltage has a level between the erase voltage and the second voltage.

16. The method of claim 15, wherein the first voltage has an intermediate value between the erase voltage and the second voltage.

17. The method of claim 12, further comprising:
setting the number of erase-program cycles to an initial value before the performing of the erase operations on the block and the first sub-block.

18. The method of claim 17, further comprising:
increasing the number of erase-program cycles after the performing of the erase operation on the first block or the erase operation of the first sub-block.

\* \* \* \* \*